United States Patent
Foster et al.

(10) Patent No.: US 9,756,273 B2
(45) Date of Patent: Sep. 5, 2017

(54) MULTI-TIERED TAMPER-RESISTANT ASSEMBLY SYSTEM AND METHOD

(71) Applicant: Sensors Unlimited, Inc., Princeton, NJ (US)

(72) Inventors: John T. Foster, Jersey City, NJ (US);
John Tagle, Cherry Hill, NJ (US);
Dmitry Zhilinsky, Princeton, NJ (US);
Michael A. Liland, Princeton, NJ (US);
Laszlo Kovacs, Middlesex, NJ (US);
Leonardo C. Gonzales, West Chester, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 177 days.

(21) Appl. No.: 14/638,808

(22) Filed: Mar. 4, 2015

(65) Prior Publication Data

US 2016/0261812 A1  Sep. 8, 2016

(51) Int. Cl.
*H04N 5/378* (2011.01)
*H01L 23/29* (2006.01)
*H01L 23/556* (2006.01)
*H01L 23/00* (2006.01)
*H01L 27/146* (2006.01)
*G06T 5/40* (2006.01)
*H04N 5/32* (2006.01)
*H04N 5/33* (2006.01)

(52) U.S. Cl.
CPC ............ *H04N 5/378* (2013.01); *G06T 5/40* (2013.01); *H01L 23/291* (2013.01); *H01L 23/295* (2013.01); *H01L 23/556* (2013.01); *H01L 23/57* (2013.01); *H01L 23/573* (2013.01); *H01L 27/14618* (2013.01); *H04N 5/32* (2013.01); *H04N 5/33* (2013.01); *G06T 2207/10116* (2013.01); *H01L 27/1465* (2013.01)

(58) Field of Classification Search
CPC ...................................................... H04N 5/378
See application file for complete search history.

(56) References Cited

U.S. PATENT DOCUMENTS

| 3,424,270 A | * | 1/1969 | Hartman | ........... C08L 7/00 156/281 |
| 3,722,977 A | * | 3/1973 | Sloane | ........... G02B 5/22 250/505.1 |
| 2004/0075747 A1 | * | 4/2004 | Silverbrook | ........ B41J 2/14314 348/207.99 |

(Continued)

OTHER PUBLICATIONS

Rohrman, Metals and Alloys in the Chemical Industry, Mar. 1936, J. Chem. Educ., vol. 13 Ed. 3, pp. 106-110.*

*Primary Examiner* — David Porta
*Assistant Examiner* — Jeremy S Valentiner
(74) *Attorney, Agent, or Firm* — Snell & Wilmer L.L.P.

(57) ABSTRACT

A multi-tiered approach to combating reverse engineering of electronics is disclosed herein. The encapsulant utilized with the optical sensor may be selected based on being substantially being opaque to X-ray inspection. In this way, visible public inspection to gain competitive intelligence may be reduced and operation of the electronics may remain unaffected. Additionally, a thin filament of wire embedded just below the surface of the encapsulant could be used as an electronic tripwire in response to being severed and/or dissolved by the reverse engineering strong solvents and acids.

10 Claims, 2 Drawing Sheets

(56) References Cited

U.S. PATENT DOCUMENTS

| | | | | |
|---|---|---|---|---|
| 2006/0226761 | A1* | 10/2006 | Hofmann | H01J 3/022 313/495 |
| 2012/0096813 | A1* | 4/2012 | Gooch | H01L 27/14618 53/452 |
| 2014/0042322 | A1* | 2/2014 | Treado | G01N 21/25 250/339.01 |
| 2014/0155753 | A1* | 6/2014 | McGuire, Jr. | A61B 5/6833 600/473 |
| 2014/0349448 | A1* | 11/2014 | Afzali-Ardakani | H01L 23/576 438/127 |

* cited by examiner

MULTI-TIERED TAMPER-RESISTANT ASSEMBLY SYSTEM AND METHOD

FIELD

The present disclosure relates electronics packaging, and more particularly, to systems and methods of resisting tampering and/or reverse engineering of short-wavelength infrared (SWIR) sensor packages.

BACKGROUND

A heat sink may be configured to transfer thermal energy from a higher temperature component to a lower temperature medium, such as a fluid medium. If the fluid medium is water, the heat sink may be referred to as a cold plate. In thermodynamics, a heat sink is a heat reservoir configured to absorb heat without significantly changing temperature. Heat sinks for electronic devices often have a temperature higher than the surroundings to transfer heat by convection, radiation, and/or conduction.

SUMMARY

The present disclosure relates to imaging devices. According to various embodiments, an imaging device comprising a short-wavelength infrared focal plane array is disclosed. An integrated circuit, such as a readout integrated circuit, may be encased in an encapsulant. The encapsulant may be embedded with high-radiopacity particulates. An electronic tripwire may be coupled to the readout integrated circuit. The electronic tripwire may be configured to render the readout integrated circuit inoperable in response to the electronic tripwire being severed. The high-radiopacity particulates may comprise a Z value greater than 50. The electronic tripwire may be coupled to a power source. The electronic tripwire may be integral to operation of the readout integrated circuit during normal operation of the readout integrated circuit.

According to various embodiments, the high-radiopacity particulates are selected from a group of barium sulfate, bismuth subcarbonate, bismuth oxychloride, or tungsten carbide. The electronic tripwire may be configured to dissolve in a solution configured to dissolve the encapsulant. The electronic tripwire may be configured to transmit electronic signals.

According to various embodiments, an encapsulant comprising high-radiopacity particulates embedded therein; and an electronic tripwire embedded therein and/or proximate thereto and be coupled to an integrated circuit configured to render the integrated circuit inoperable in response to the electronic tripwire being severed is disclosed. The high-radiopacity particulates may comprise a Z value greater than 50. The electronic tripwire may be coupled to a power source. The high-radiopacity particulates may be selected from a group of barium sulfate, bismuth subcarbonate, bismuth oxychloride, or tungsten carbide. The electronic tripwire may be configured to dissolve in a solution configured to dissolve the encapsulant, wherein the dissolving acts to trigger the electronic tripwire.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

The present disclosure relates to making electronics packages tamper resistant and/or reducing the effectiveness of reverse engineering activities. For instance, a typical reverse engineering approach may include a hierarchical analysis being performed on an electronic device. The electronic device may include a physical tear down of circuit boards of the device. The connections between circuit boards may be recorded. Circuit extraction of semiconductor chips may include package removal, delayering, imaging, annotation, a schematic read-back, and further analysis.

For instance, "package removal" may refer to exposing the semiconductor chip to a corrosive acid solution. A variety of acids at various temperatures may be used as the corrosive acid solution. These solutions may dissolve away an encapsulant and/or packaging material that may be covering the circuits of the semiconductor chip but not damage the underlying die and/or circuits. Mechanical or thermal treatment may also be used in some cases to remove encapsulant from a semiconductor chip, such as may be the case in hermetically sealed and ceramic electronic packages. An additional reverse engineering technique includes X-ray examination. For instance, x-ray examination may be used to determine circuit layout within an encapsulant.

Figure 1:
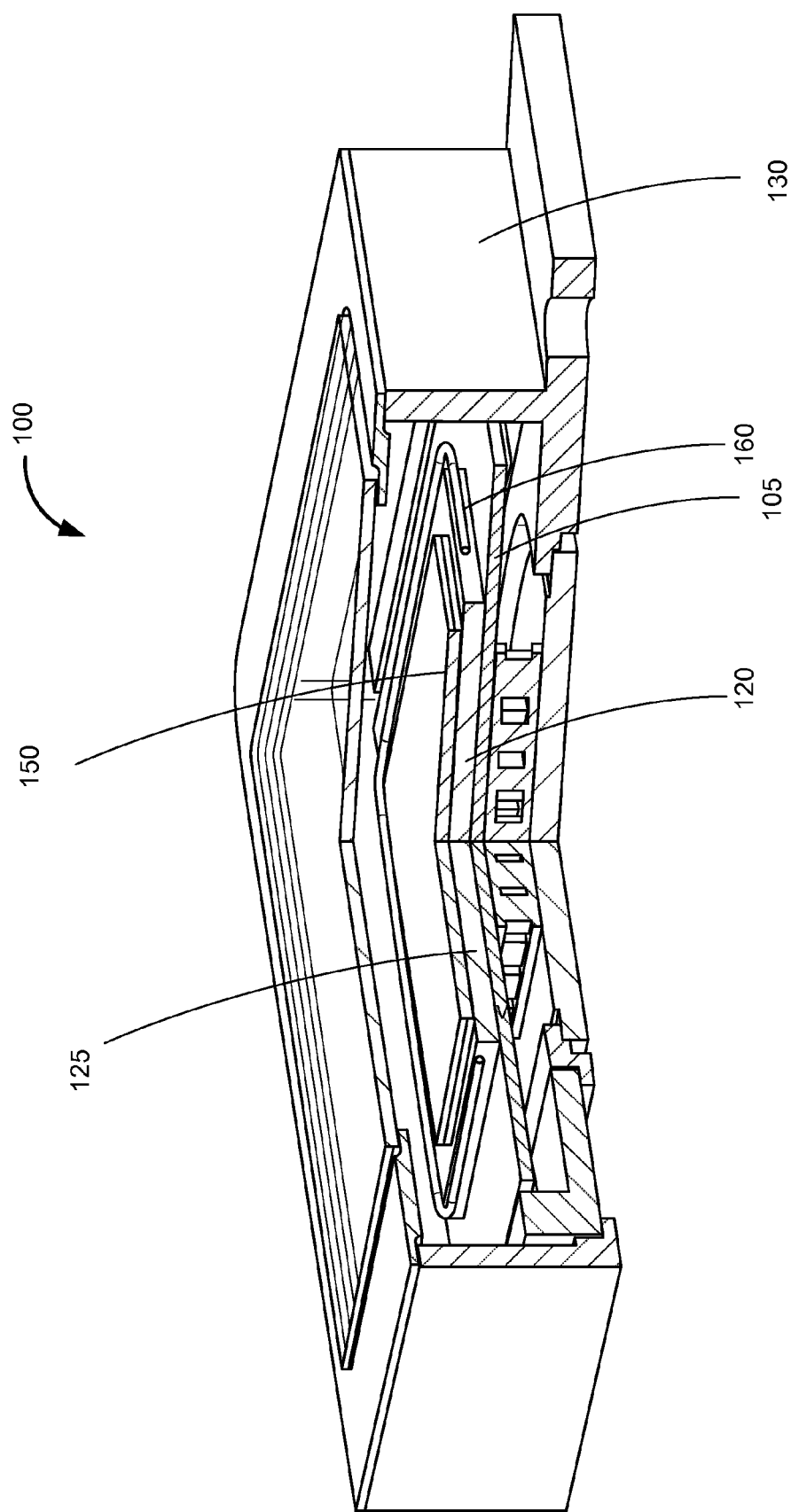
FIG. 1 depicts a representative imaging device in accordance with various embodiments.

According to various embodiments and with reference to FIG. 1, an input image acquired by an imaging device 100, such as a SWIR camera, sensor, short-wavelength infrared focal plane array, or any other imaging device, is processed to produce an input histogram representing the distribution of pixel intensities in the input image. As described herein, the Focal Plane Array (FPA) can refer to either the combination of a Photodiode Array (PDA) and Readout Integrated Circuit (ROIC) once wired together, or alternately, the entire device shown in FIG. 1 as imaging device 100.

The imaging device 100 may be contained within a housing 130, such as a nickel-cobalt ferrous alloy housing. Optionally, saturated and/or low pixels in the input image can be excluded. Histogram start and end points are determined, and a variable plateau is calculated depending upon the type of enhancement desired. The plateau may be varied along the histogram and can take on any desired shape, size, or number of plateau regions. When the plateau is calculated, the histogram is clipped. A cumulative histogram is constructed from the clipped histogram, and is normalized. The input image is then transformed into an enhanced output image using the normalized cumulative histogram as a look-up table. Optional non-linear operations can be performed on the normalized cumulative histogram. The enhancement method can be automatically varied to adapt to various imaging device types.

In contrast to encapsulants utilized in other electronics applications, the encapsulants disclosed herein may be positioned based on their ability to facilitate continued operation of the SWIR electronics. The encapsulant 105 may substantially cover the ROIC but not the PDA, so as to avoid optical interference. In this way, operation of the imaging device 100 may remain unaffected. The epoxy encapsulant 105 may be chosen to be utilized with a SWIR focal plane array 150.

According to various embodiments, an opaque epoxy encapsulant 105 may be embedded with a high concentration of particles made of a material with a high radiopacity in the x-ray band. This high concentration of particles may substantially surround and cover a ROIC 125 and any associated electronics in an opto-electronic package 120, however, the encapsulant 105 may not cover the PDA to avoid optical interference. This concentration of high atomic number (e.g., Z) particles may be located in areas of interest proximate circuitry, such as integrated circuit (ROIC) 125 and associated electronics. The high radiopacity material, e.g., high concentration of particles made of a material with a high radiopacity in the x-ray band) may be selected to be transparent in a wavelength band of interest for operation of the imaging device 100. The high radiopacity material is radio opaque to x-rays that may comprise a concentration of particles that have high radiopacity to x-rays. In this way, the encapsulant may comprise a radio blocking material that blocks x-rays through radiodensity. Radio opaque as used herein may refer to a relative inability of electromagnetic radiation, particularly X-rays, to pass through a particular material.

In combination with radiopaque (or radiodense) compounds or alone, the encapsulant 105 may be seeded with a class of compounds referred to as "monochromating crystals", which have been ground to a fine particle size. Two examples of this class of compounds would be Lithium Fluoride (LiF) and Indium Antimonide (InSb). These compounds may reflect and/or refract X-rays at specific angles. Ground into a fine powder and embedded in the encapsulant, the compounds may be configured to cause X-rays used to inspect the imaging device 100 to be reflected at random angles, further hindering attempts at reverse engineering.

Embedding the epoxy encapsulant 105 with particles of a high-radiopacity material (that is, highly opaque in the X-ray band), may be configured to hinder attempts at reverse engineering the structure of ROICs 125 by way of X-ray examination. The high-radiopacity materials may include materials commonly used in medical devices for absorption of X-rays, (e.g. Barium Sulfate, Bismuth Subcarbonate, Bismuth Oxychloride, and/or Tungsten Carbide). However, any epoxy encapsulant 105 compound containing high-Z (e.g., Z value greater than 50) elements may suffice. These high-Z elements may be any size, such as on the nanoparticle scale.

A method currently in use for reverse-engineering electronics is to dissolve the epoxy encapsulant with a mixture of strong solvents and acids. This approach is limited to well-funded entities, as the equipment required to do this safely without destroying the device is costly. The chemical mixtures used in this process typically utilize nitric acid as one of its ingredients.

According to various embodiments, a thin filament of wire embedded just below the surface of the encapsulant could be used as an "electronic tripwire" 160. The electronic tripwire 160 may be configured to both carry an electronic signal and dissolve in a solvent utilized to remove an epoxy encapsulant 105, such as nitric acid. In response to being tripped, the electronic tripwire 160 may render the associated circuitry, such as the circuitry associated with the integrated circuit (ROIC) 125 and associated electronics useless. For instance, in response to the electronic tripwire 160 being tripped and/or triggered, a self-destruct mechanism may be enacted. In this way, in response to being severed and/or dissolved by the reverse engineering via strong solvents and acids, a charge may be transmitted through the circuitry to render the ROIC 125 and associated electronics, such as an opto-electronics package 120, useless and/or inoperable. Stated another way, the electronic tripwire 160 may prevent a charge from being dissipated through a portion of the electronics; however, in response to being severed and/or dissolved, the charge may be released. In this way, the electronic tripwire 160 may be coupled to a power supply, such as a capacitor and/or battery.

Similarly, in response to the electronic tripwire 160 being severed and/or dissolved by the reverse engineering strong solvents and acids, internal memory may be erased. In this way, the electronic tripwire 160 may add an extra layer of defense against reverse engineering.

According to various embodiments, the electronic tripwire 160 may be integral to the circuitry and utilized in normal operation of the device. For instance, the electronic tripwire 160 may be a non-traditional circuitry material capable of transmitting electric signals. These circuits integral to the operation of the electronics, such as SWIR electronics, made from "trip wire" materials, may dissolve with the dissolving of the encapsulant, rendering reverse engineering difficult and/or unlikely. The electronic tripwire 160 may be made from a material which is highly susceptible to attack by nitric acid. Stated another way, the electronic tripwire 160 may dissolve along with the epoxy encapsulant 105. According to various embodiments, the electronic tripwire 160 may be made from copper, silver, or nickel. The electronic tripwire 160 filament may be embedded proximate to and/or below the encapsulant 105 surface.

Figure 2:
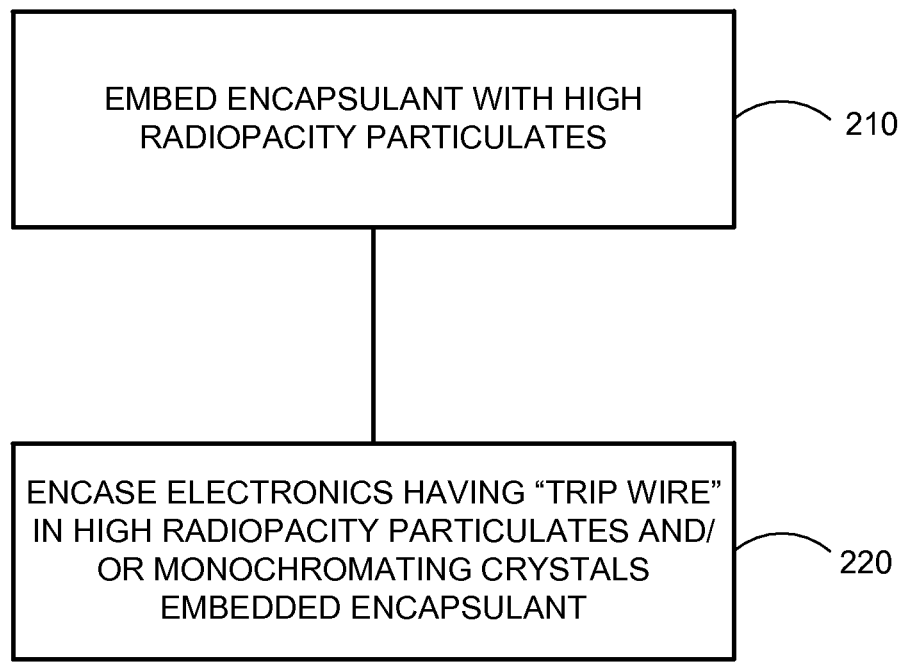
FIG. 2 depicts a multi-tiered reverse engineering deterrence approach, in accordance with various embodiments.

According to various embodiments, and with reference to FIG. 2, a method of providing a multi-tiered approach to protecting electronics, specifically SWIR electronics from reverse engineering is disclosed. An encapsulant may be embedded with high-radiopacity particulates or monochromating crystals (step 210). This embedded encapsulant may encase an electronic tripwire, which upon tripping and/or dissolving will substantially render the electronics inoperable and reduce susceptibility to reverse engineering (step 220).

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more."

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An imaging device comprising:
   a short-wavelength infrared focal plane array;
   a readout integrated circuit encased in an encapsulant, wherein the encapsulant is embedded with high-radiopacity particulates comprising a Z value greater than 50; and
   an electronic tripwire coupled to the readout integrated circuit configured to render the readout integrated circuit useless for reverse engineering in response to the electronic tripwire being severed,
   wherein the electronic tripwire is configured to dissolve in a solution,
   the solution configured to dissolve the encapsulant, and
   the readout integrated circuit resistant to being dissolved by the solution,
   wherein the electronic tripwire is coupled to a power source, and
   the trip wire prevents a charge from being released from the power source and dissipated through the readout integrated circuit.

2. The imaging device of claim 1, wherein the electronic tripwire is integral to operation of the readout integrated circuit during normal operation of the readout integrated circuit.

3. The imaging device of claim 1, wherein the high-radiopacity particulates are selected from a group comprising barium sulfate, bismuth subcarbonate, bismuth oxychloride, and tungsten carbide.

4. The imaging device of claim 1, wherein the encapsulant is embedded with monochromating crystals.

5. The imaging device of claim 1, wherein the electronic tripwire is at least one of copper, silver, or nickel.

6. The imaging device of claim 1, wherein the electronic tripwire is configured to transmit electronic signals.

7. An encapsulant comprising:
   high-radiopacity particulates embedded in the encapsulant, wherein the high-radiopacity particulates comprises a Z value greater than 50; and
   an electronic tripwire embedded in the encapsulant, wherein the electronic tripwire is configured to be coupled to an integrated circuit configured to render the integrated circuit inoperable for signal processing in response to the electronic tripwire being severed,
   wherein the electronic tripwire is configured to dissolve in a solution,
   the solution configured to dissolve the encapsulant,
   the readout integrated circuit resistant to being dissolved by the solution, and
   the dissolving acts to trigger the electronic tripwire;
   wherein the electronic tripwire is configured to be coupled to a power source, and
   the trip wire prevents a charge from being released from the power source and dissipated through the readout integrated circuit.

8. The encapsulant of claim 7, wherein the high-radiopacity particulates are selected from a group of barium sulfate, bismuth subcarbonate, bismuth oxychloride, or tungsten carbide.

9. The encapsulant of claim 7, wherein the encapsulant is embedded with monochromating crystals.

10. The imaging device of claim 1, wherein the charge is released in response to the trip wire being severed.

* * * * *